United States Patent
Rajski et al.

(10) Patent No.: US 8,108,743 B2
(45) Date of Patent: *Jan. 31, 2012

(54) METHOD AND APPARATUS FOR SELECTIVELY COMPACTING TEST RESPONSES

(75) Inventors: Janusz Rajski, West Linn, OR (US); Jerzy Tyszer, Poznan (PL); Mark Kassab, Wilsonville, OR (US); Nilanjan Mukherjee, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/891,498

(22) Filed: Sep. 27, 2010

(65) Prior Publication Data

US 2011/0138242 A1 Jun. 9, 2011

Related U.S. Application Data

(63) Continuation of application No. 12/396,377, filed on Mar. 2, 2009, now Pat. No. 7,805,649, which is a continuation of application No. 10/973,522, filed on Oct. 25, 2004, now Pat. No. 7,500,163, which is a continuation of application No. 10/354,576, filed on Jan. 29, 2003, now Pat. No. 6,829,740, which is a continuation of application No. 09/619,988, filed on Jul. 20, 2000, now Pat. No. 6,557,129.

(60) Provisional application No. 60/167,136, filed on Nov. 23, 1999.

(51) Int. Cl.
*G01R 31/28* (2006.01)

(52) U.S. Cl. ........................................ 714/732; 714/729

(58) Field of Classification Search .................. 714/726, 714/729, 732
See application file for complete search history.

(56) References Cited

U.S. PATENT DOCUMENTS

| 519,078 A | 5/1894 | Wilson |
| 713,605 A | 11/1902 | Churchward |

(Continued)

FOREIGN PATENT DOCUMENTS

EP 0 108 256 5/1984

(Continued)

OTHER PUBLICATIONS

U.S. Appl. No. 09/619,985, filed Jul. 20, 2000, Rajski et al.

(Continued)

*Primary Examiner* — Cynthia Britt
(74) *Attorney, Agent, or Firm* — Klarquist Sparkman, LLP

(57) ABSTRACT

A method and apparatus to compact test responses containing unknown values or multiple fault effects in a deterministic test environment. The proposed selective compactor employs a linear compactor with selection circuitry for selectively passing test responses to the compactor. In one embodiment, gating logic is controlled by a control register, a decoder, and flag registers. This circuitry, in conjunction with any conventional parallel test-response compaction scheme, allows control circuitry to selectively enable serial outputs of desired scan chains to be fed into a parallel compactor at a particular clock rate. A first flag register determines whether all, or only some, scan chain outputs are enabled and fed through the compactor. A second flag register determines if the scan chain selected by the selector register is enabled and all other scan chains are disabled, or the selected scan chain is disabled and all other scan chains are enabled. Other embodiments allow selective masking of a variable number of scan chain outputs.

17 Claims, 9 Drawing Sheets

U.S. PATENT DOCUMENTS

| | | |
|---|---|---|
| 3,614,400 A | 10/1971 | Farnett |
| 3,700,869 A | 10/1972 | Low et al. |
| 4,024,460 A | 5/1977 | Vifian |
| 4,122,399 A | 10/1978 | Heiter et al. |
| 4,161,041 A | 7/1979 | Butler et al. |
| 4,320,509 A | 3/1982 | Davidson |
| 4,503,537 A | 3/1985 | McAnney |
| 4,513,418 A | 4/1985 | Bardell, Jr. et al. |
| 4,536,881 A | 8/1985 | Kasuya |
| 4,602,210 A | 7/1986 | Fasang et al. |
| 4,687,988 A | 8/1987 | Eichelberger et al. |
| 4,754,215 A | 6/1988 | Kawai |
| 4,785,410 A | 11/1988 | Hamatsu et al. |
| 4,801,870 A | 1/1989 | Eichelberger et al. |
| 4,827,476 A | 5/1989 | Garcia |
| 4,860,236 A | 8/1989 | McLeod et al. |
| 4,910,735 A | 3/1990 | Yamashita |
| 4,959,832 A | 9/1990 | Bardell, Jr. |
| 4,974,184 A | 11/1990 | Avra |
| 5,072,178 A | 12/1991 | Matsumoto |
| 5,090,035 A | 2/1992 | Murase |
| 5,138,619 A | 8/1992 | Fasang et al. |
| 5,167,034 A | 11/1992 | MacLean, Jr. et al. |
| 5,173,906 A | 12/1992 | Dreibelbis et al. |
| 5,202,889 A | 4/1993 | Aharon et al. |
| 5,258,986 A | 11/1993 | Zerbe |
| 5,268,949 A | 12/1993 | Watanabe et al. |
| 5,293,123 A | 3/1994 | Jordan et al. |
| 5,301,199 A | 4/1994 | Ikenaga et al. |
| 5,325,367 A | 6/1994 | Dekker et al. |
| 5,349,587 A | 9/1994 | Nadeau-Dostie et al. |
| 5,369,648 A | 11/1994 | Nelson |
| 5,394,405 A | 2/1995 | Savir |
| 5,412,665 A | 5/1995 | Gruodis et al. |
| 5,414,716 A | 5/1995 | Bershteyn |
| 5,416,783 A | 5/1995 | Broseghini et al. |
| 5,444,716 A | 8/1995 | Jarwala et al. |
| 5,446,683 A | 8/1995 | Mullen et al. |
| 5,450,414 A | 9/1995 | Lin |
| 5,524,114 A | 6/1996 | Peng |
| 5,533,128 A | 7/1996 | Vobach |
| 5,553,082 A | 9/1996 | Connor et al. |
| 5,574,733 A | 11/1996 | Kim |
| 5,586,125 A | 12/1996 | Warner |
| 5,588,006 A | 12/1996 | Nozuyama |
| 5,592,493 A | 1/1997 | Crouch et al. |
| 5,608,870 A | 3/1997 | Valiant |
| 5,612,963 A | 3/1997 | Koenemann et al. |
| 5,614,838 A | 3/1997 | Jaber et al. |
| 5,617,531 A | 4/1997 | Crouch et al. |
| 5,631,913 A | 5/1997 | Maeda |
| 5,642,362 A | 6/1997 | Savir |
| 5,668,817 A | 9/1997 | Adham |
| 5,680,543 A | 10/1997 | Bhawmik |
| 5,694,401 A | 12/1997 | Gibson |
| 5,694,402 A | 12/1997 | Butler et al. |
| 5,701,308 A | 12/1997 | Attaway et al. |
| 5,701,309 A | 12/1997 | Gearhardt et al. |
| 5,717,701 A | 2/1998 | Angelotti et al. |
| 5,717,702 A | 2/1998 | Stokes et al. |
| 5,719,913 A | 2/1998 | Maeno |
| 5,748,497 A | 5/1998 | Scott et al. |
| 5,761,489 A | 6/1998 | Broseghini et al. |
| 5,790,562 A | 8/1998 | Murray et al. |
| 5,790,626 A | 8/1998 | Johnson et al. |
| 5,812,561 A | 9/1998 | Giles et al. |
| 5,831,992 A | 11/1998 | Wu |
| 5,848,198 A | 12/1998 | Penn |
| 5,867,507 A | 2/1999 | Beebe et al. |
| 5,870,476 A | 2/1999 | Fischer |
| 5,872,793 A | 2/1999 | Attaway et al. |
| 5,883,906 A | 3/1999 | Turnquist et al. |
| 5,899,961 A | 5/1999 | Sundermann |
| 5,905,986 A | 5/1999 | Rohrbaugh et al. |
| 5,938,784 A | 8/1999 | Kim |
| 5,968,194 A | 10/1999 | Wu et al. |
| 5,974,179 A | 10/1999 | Caklovic |
| 5,974,433 A | 10/1999 | Currie |
| 5,983,380 A | 11/1999 | Motika et al. |
| 5,991,898 A | 11/1999 | Rajski et al. |
| 5,991,909 A | 11/1999 | Rajski et al. |
| 6,006,349 A | 12/1999 | Fujisaki |
| 6,014,763 A | 1/2000 | Dhong et al. |
| 6,021,513 A | 2/2000 | Beebe et al. |
| 6,026,508 A | 2/2000 | Craft |
| 6,029,263 A | 2/2000 | Gibson |
| 6,041,429 A | 3/2000 | Koenemann |
| 6,052,245 A | 4/2000 | Sugawara et al. |
| 6,055,658 A | 4/2000 | Jaber et al. |
| 6,061,818 A | 5/2000 | Touba et al. |
| 6,072,823 A | 6/2000 | Takakusaki |
| 6,100,716 A | 8/2000 | Adham et al. |
| 6,122,761 A | 9/2000 | Park |
| 6,141,669 A | 10/2000 | Carleton |
| 6,148,425 A | 11/2000 | Bhawmik et al. |
| 6,158,032 A | 12/2000 | Currier et al. |
| 6,178,532 B1 | 1/2001 | Pierce et al. |
| 6,181,164 B1 | 1/2001 | Miller |
| 6,199,182 B1 | 3/2001 | Whetsel |
| 6,240,432 B1 | 5/2001 | Chuang et al. |
| 6,256,759 B1 | 7/2001 | Bhawmik et al. |
| 6,256,760 B1 | 7/2001 | Carron et al. |
| 6,272,653 B1 | 8/2001 | Amstutz |
| 6,286,119 B1 | 9/2001 | Wu et al. |
| 6,300,885 B1 | 10/2001 | Davenport et al. |
| 6,308,290 B1 | 10/2001 | Forlenza et al. |
| 6,308,291 B1 | 10/2001 | Kock et al. |
| 6,327,685 B1 | 12/2001 | Koprowski et al. |
| 6,327,687 B1 | 12/2001 | Rajski et al. |
| 6,330,681 B1 | 12/2001 | Cote et al. |
| 6,353,842 B1 | 3/2002 | Rajski et al. |
| 6,385,750 B1 | 5/2002 | Kapur et al. |
| 6,421,794 B1 | 7/2002 | Chen et al. |
| 6,463,560 B1 | 10/2002 | Bhawmik et al. |
| 6,467,058 B1 | 10/2002 | Chakradhar et al. |
| 6,510,398 B1 | 1/2003 | Kundu et al. |
| 6,539,409 B2 | 3/2003 | Rajski et al. |
| 6,543,020 B2 | 4/2003 | Rajski et al. |
| 6,557,129 B1 | 4/2003 | Rajski et al. |
| 6,590,929 B1 | 7/2003 | Williams |
| 6,611,933 B1 | 8/2003 | Koenemann et al. |
| 6,618,826 B1 | 9/2003 | Chen et al. |
| 6,684,358 B1 | 1/2004 | Rajski et al. |
| 6,694,466 B1 | 2/2004 | Tsai et al. |
| 6,708,192 B2 | 3/2004 | Rajski et al. |
| 6,763,488 B2 | 7/2004 | Whetsel |
| 6,829,740 B2 | 12/2004 | Rajski et al. |
| 6,874,109 B1 | 3/2005 | Rajski et al. |
| 7,001,461 B2 | 2/2006 | Taniguchi et al. |
| 7,093,175 B2 | 8/2006 | Rajski et al. |
| 7,111,209 B2 | 9/2006 | Rajski et al. |
| 7,260,591 B2 | 8/2007 | Rajski et al. |
| 7,263,641 B2 | 8/2007 | Rajski et al. |
| 7,478,296 B2 | 1/2009 | Rajski et al. |
| 7,493,540 B1 | 2/2009 | Rajski et al. |
| 7,500,163 B2 | 3/2009 | Rajski et al. |
| 7,506,232 B2 | 3/2009 | Rajski et al. |
| 7,509,546 B2 | 3/2009 | Rajski et al. |
| 7,523,372 B2 | 4/2009 | Rajski et al. |
| 7,563,641 B2 | 7/2009 | Wang et al. |
| 7,653,851 B2 | 1/2010 | Rajski et al. |
| 7,805,649 B2 * | 9/2010 | Rajski et al. .................. 714/732 |
| 7,805,651 B2 | 9/2010 | Rajski et al. |
| 7,865,794 B2 | 1/2011 | Rajski et al. |
| 7,877,656 B2 | 1/2011 | Rajski et al. |
| 7,900,104 B2 | 3/2011 | Rajski et al. |
| 2002/0112199 A1 | 8/2002 | Whetsel |
| 2002/0124217 A1 | 9/2002 | Hiraide et al. |
| 2003/0115521 A1 | 6/2003 | Rajski et al. |
| 2003/0120988 A1 | 6/2003 | Rajski et al. |
| 2003/0131298 A1 | 7/2003 | Rajski et al. |
| 2004/0128599 A1 | 7/2004 | Rajski et al. |
| 2004/0172431 A1 | 9/2004 | Rajski et al. |
| 2005/0015688 A1 | 1/2005 | Rajski et al. |
| 2005/0097419 A1 | 5/2005 | Rajski et al. |

FOREIGN PATENT DOCUMENTS

| | | |
|---|---|---|
| EP | 0 372 226 | 6/1990 |
| EP | 0 438 322 | 7/1991 |
| EP | 0 481 097 | 4/1992 |
| EP | 0 549 949 | 3/1998 |
| EP | 0 887 930 | 12/1998 |
| EP | 1 256 008 A0 | 11/2002 |
| EP | 1 256 008 B1 | 8/2006 |
| EP | 1 722 246 A2 | 11/2006 |
| EP | 2 146 212 | 1/2010 |
| JP | 63-286780 | 11/1988 |
| JP | 01-239486 | 9/1989 |
| JP | 03-2579 | 1/1991 |
| JP | 03-012573 | 1/1991 |
| JP | 4-236378 | 8/1992 |
| JP | 05-215816 | 8/1993 |
| JP | 05-249197 | 9/1993 |
| JP | 07-174822 | 7/1995 |
| JP | 07-198791 | 8/1995 |
| JP | 08-015382 | 1/1996 |
| JP | 9-130378 | 5/1997 |
| JP | 11-006852 | 1/1999 |
| JP | 11-030646 | 2/1999 |
| JP | 11-153655 | 6/1999 |
| JP | 11-174126 | 7/1999 |
| JP | 11-264860 | 9/1999 |
| JP | 2004-500558 | 1/2004 |
| JP | 4047584 | 11/2007 |
| WO | WO 91/10182 | 7/1991 |
| WO | WO 01/38889 | 5/2001 |
| WO | WO 01/38890 | 5/2001 |
| WO | WO 01/38891 | 5/2001 |
| WO | WO 01/38955 | 5/2001 |
| WO | WO 01/38981 | 5/2001 |
| WO | WO 01/39254 | 5/2001 |

OTHER PUBLICATIONS

U.S. Appl. No. 09/619,988, filed Jul. 20, 2000, Rajski et al.
U.S. Appl. No. 09/620,021, filed Jul. 20, 2000, Rajski et al.
U.S. Appl. No. 09/620,023, filed Jul. 20, 2000, Rajski et al.
U.S. Appl. No. 09/713,662, filed Nov. 15, 2000, Rajski et al.
U.S. Appl. No. 09/713,664, filed Nov. 15, 2000, Rajski et al.
Aitken et al., "A Diagnosis Method Using Pseudo-Random Vectors Without Intermediate Signatures," *Proc. ICCAD*, pp. 574-577 (1989).
Bardell, "Design Considerations for Parallel Pseudorandom Pattern Generators", *Journal of Electronic Testing: Theory and Applications*, vol. 1, pp. 73-87 (1990).
Bardell et al., "Pseudorandom arrays for built-in tests," *IEEE Trans. on Computers*, vol. C-35, No. 7, pp. 653-658 (1986).
Bardell et al., "Pseudorandom Sequence Generators," in *Built in test for VLSI: Pseudorandom Techniques*, Chapter 3, pp. 61-88 (1987).
Bardell et al., "Test Response Compression Techniques," in *Built-In Test for VLSI Pseudorandom Techniques*, Chapter 4, pp. 89-108 (1987).
Bassett et al., "Low-Cost Testing of High-Density Logic Components," *IEEE Design & Test of Computers*, pp. 15-28 (Apr. 1990).
Benowitz et al., "An Advanced Fault Isolation System for Digital Logic," *IEEE Trans. on Computers*, vol. C-24, No. 5, pp. 489-497 (May 1975).
Bershteyn, "Calculation of Multiple Sets of Weights for Weighted Random Testing," *Proc. ITC*, pp. 1031-1040 (1993).
Bhattacharya et al., "Zero-Aliasing Space Compression using a Single Periodic Output and its Application to Testing of Embedded Cores," *VLSI Design*, 6 pp. (Jan. 2000).
Chakrabarty et al., "Design of Built-In Test Generator Circuits Using Width Compression," *IEEE Trans. on Computer-Aided Design of Integrated Circuits and Systems*, vol. 17, No. 10, pp. 1044-1051 (Oct. 1998).
Chakrabarty et al., "Optimal space compaction of test responses," *Proc. ITC*, pp. 834-843 (1995).
Chakrabarty et al., "Optimal Zero-Aliasing Space Compaction of Test Responses," *IEEE Trans. on Computers*, vol. 47, No. 11, pp. 1171-1187 (Nov. 1998).
Chakrabarty et al., "Test response compaction using multiplexed parity trees," *IEEE Transactions CAD of Integrated Circuits and Systems*, vol. CAD-15, No. 11, pp. 1399-1408 (1996).
Chakrabarty et al., "Test Width Compression for Built-In Self Testing," *Proc. ITC*, pp. 328-337 (Nov. 1997).
Chakrabarty, "Zero-Aliasing Space Compaction Using Linear Compactors With Bounded Overhead," *IEEE Transactions on CAD of Integrated Circuits and Systems*, vol. 17, No. 5, pp. 452-457 (May 1998).
European Search Report dated Dec. 1, 2009, from European Application No. EP 09 17 5449.
European Communication dated Aug. 3, 2010, from European Application No. EP 09 17 5449.9.
Supplementary European Search Report dated Nov. 15, 2004, from European Application No. EP 00 98 0401.
European Communication dated Feb. 1, 2005, from European Application No. EP 00 98 0401.
European Communication under Rule 51(4) EPC dated Mar. 17, 2006, from European Application No. EP 00 98 0401.
European Communication, including European Search Report, dated Oct. 26, 2006, from European Application No. EP 06 01 5955.
European Communication dated Jun. 14, 2007, from European Application No. EP 06 01 5955.
European Communication dated Apr. 8, 2008, from European Application No. EP 06 01 5955.
European Communication under Rule 71(3) EPC dated May 25, 2009, from European Application No. EP 06 01 5955.
Fagot et al., "On Calculating Efficient LFSR Seeds for Built-In Self Test," *IEEE*, pp. 7-14 (1999).
Frohwerk, "Signature analysis: a new digital field services method," *Hewlett-Packard Journal*, pp. 2-8 (May 1977).
Ghosh-Dastidar et al., "Fault Diagnosis in Scan-Based BIST Using Both Time and Space Information," *Proc. ITC*, pp. 95-102 (Sep. 1999).
Golomb, *Shift Register Sequences*, Holden Day, San Francisco (1967).
Hamzaoglu et al., "Reducing Test Application Time for Full Scan Embedded Cores," *IEEE Proc. FTCS*, pp. 260-267 (1999).
Hayes, "Check sum test methods," *Proc. FTCS*, pp. 114-120 (1976).
Hayes, "Transition count testing of combinational logic circuits," *IEEE Transactions on Computers*, vol. C-25, No. 6, pp. 613-620 (1976).
Hellebrand et al., "Built-in Test for Circuits With Scan Based on Reseeding of Multiple Polynomial Linear Feedback Shift Registers," *IEEE Trans. On Computers*, vol. C-44, pp. 223-233 (Feb.1995).
Hellebrand et al., "Generation of Vector Patterns Through Reseeding of Multiple-Polynomial Linear Feedback Shift Registers," *IEEE International Test Conference*, pp. 120-129 (1992).
Hellebrand et al., "Pattern Generation for a Deterministic BIST Scheme," *Proc. I-ICAD*, pp. 88-94 (1995).
Hetherington et al., "Logic BIST for Large Industrial Designs: Real Issues and Case Studies," *Proc. ITC*, pp. 358-367 (1999).
International Preliminary Examination Report dated May 30, 2002, from International Application No. PCT/US00/31376.
International Search Report dated Feb. 26, 2001, from International Application No. PCT/US00/31376.
Ireland et al., "Matrix method to determine shift-register connections for delayed pseudorandom binary sequences," *Electronics Letters*, vol. 4 No. 15, pp. 309-310 (1968).
Ishida et al., "COMPACT: A hybrid method for compressing test data," *Proc. VLSI Test Symposium*, pp. 62-69 (1998).
Ivanov et al., "Programmable BIST space compactors," *IEEE Transactions on Computers*, vol. C-45, No. 12, pp. 1393-1404 (1996).
Iyengar et al., "Built-In Self-testing of sequential circuits using precomputed test sets," *Proc. VLSI Test Symposium*, pp. 418-423 (1998).
Japanese Notice of Grounds for Rejection dated Apr. 5, 2005, from Japanese Application No. 2001-540386.
Japanese Notice of Grounds for Rejection dated Aug. 7, 2006, from Japanese Application No. 2001-540386.

Jas et al., "Scan vector compression/decompression using statistical coding," *Proc. VLSI Test Symposium*, pp. 114-120 (1999).

Jas et al., "Test vector decompression via cyclical scan chains and its application to testing core-based designs," *Proc. ITC*, pp. 458-464 (1998).

Jone et al., "Space compression method for built-in self testing of VLSI circuits," *Int. Journal of Computer Aided VLSI Design*, vol. 3, pp. 309-322 (1991).

Kapur et al., "Design of an efficient weighted random pattern generation system," *Proc. ITC.*, pp. 491-500 (1994).

Karpovsky et al., "Board-Level Diagnosis by Signature Analysis," *Proc. ITC*, pp. 47-53 (1988).

Karpovsky et al., "Design of Self-Diagnostic Boards by Multiple Signature Analysis," *IEEE Trans. on Computers*, vol. 42, No. 9, pp. 1035-1044 (Sep. 1993).

Kiln et al., "On using signature registers as pseudorandom pattern generators in built-in self-testing," *IEEE Trans. CAD of IC*, vol. CAD-7, No. 8, 1988, pp. 919-928.

Koenemann, c/o IBM Corp. , B56/901, "LFSR-Coded Test Patterns for Scan Designs," *Proc. European Test Conference*, pp. 237-242 (1991).

Konemann et al., "Built-In Logic Block Observation Techniques," *IEEE Test Conference*, 6 pp. (1979).

Kundu, "On Diagnosis of Faults in a Scan-Chain," *Proc. VLSI Test Symp.*, pp. 303-308 (1993).

Langdon, Jr., "An Introduction to Arithmetic Coding," *IBM J. Res. Develop.*, vol. 28, No. 2, pp. 135-149 (Mar. 1984).

Latawiec, "New method of generation of shifted linear pseudorandom binary sequences," *Proc. IEE*, vol. 121, No. 8, pp. 905-906 (1974).

Lew Yan Voon et al., "BIST Linear Generator based on Complemented Outputs," *IEEE VLSI Test Symp.*, pp. 137-142 (1992).

Li et al., "Space compression methods with output data modification," *IEEE Trans. CAD if Integrated Circuits and Systems*, vol. CAD-6, No. 2, pp. 290-294 (1987).

Mano, "Decoders and Multiplexers," in *Computer System Architecture*, Chapter 2, pp. 50-54 (1982).

Mrugalski et al., "Synthesis of pattern generators based on cellular automata with phase shifters," *Proc. ITC*, pp. 368-377 (1999).

Muradali et al., "A new procedure for weighted random built-in self-test," *Proc. ITC.*, pp. 600-669 (1990).

Narayanan et al., "An Efficient Scheme to Diagnose Scan Chains," *Proc. ITC*, pp. 704-713 (1997).

Pateras et al., "Cube-contained random patterns and their application to the complete testing of synthesized multi-level circuits," *Proc. ITC.*, pp. 473-482 (1991).

Pouya et al., "Synthesis of zero-aliasing elementary-tree space compactors," *Proc. VLSI Test Symp.*, pp. 70-77 (1998).

Rajski et al., "Accumulator-based compaction of test responses," *IEEE Trans. on Computers*, vol. C-42, No. 6, pp. 643-650 (1993).

Rajski et al., Chapter 3, "Test Response Compaction," and Chapter 4, "Fault Diagnosis," in *Arithmetic Built-In Self-Test for Embedded Systems*, pp. 87-133 (1998).

Rajski et al., "Automated Synthesis of Large Phase Shifters for Built-In Self-Test," *Proc. ITC*, Paper 41.1, pp. 1047-1056, (1998).

Rajski et al., "Decompression of Test Data Using Variable-Length Seed LFSRs," *Proc. VLSI Test Symp.*, pp. 426-433, (1995).

Rajski et al., "Design of Phase Shifters for BIST Applications," *Proc. VLSI Test Symp.*, pp. 218-224 (1998).

Rajski et al., "Diagnosis of Scan Cells in BIST Environment," *IEEE Trans. on Computers*, vol. 48, No. 7, pp. 724-731 (Jul. 1999).

Rajski et al., "Test Data Decompression for Multiple Scan Designs with Boundary Scan," *IEEE Trans. on Computers*, vol. 47, No. 11, pp. 1188-1200 (Nov. 1998).

Rajski et al., "Test responses compaction in accumulators with rotate carry adders," *IEEE Trans. CAD of Integrated Circuits and Systems*, vol. CAD-12, No. 4, pp. 531-539 (1993).

Reddy et al., "A Data compression technique for built-in self-test," *IEEE Trans. on Computers*, vol. C-37, pp. 1151-1156 (1988).

Saluja et al., "Testing Computer Hardware through Data Compression in Space and Time," *Proc. ITC*, pp. 83-88 (1983).

Savir, "Syndrome-testable design of combinational circuits," *IEEE Trans. on Computers*, vol. C-29, No. 6, pp. 442-451 (1980).

Saxena et al., "Accumulator compression testing," *IEEE Trans. on Computers*, vol. C-35, No. 4, pp. 317-321 (1986).

Saxena et al., "Analysis of checksums, extended-precision checksums, and cyclic redundancy," *IEEE Trans. on Computers*, vol. C-39, No. 7, pp. 969-975, 1990.

Saxena et al., "Extended precision checksums," *Proc. FTCS*, pp. 142-147 (1987).

Serra et al., "The analysis of one-dimensional linear cellular automata and their aliasing properties," *IEEE Trans. CAD of Integrated Circuits and Systems*, vol. CAD-9, No. 7, pp. 767-778 (1990).

Smith, "Measures of the effectiveness of fault signature analysis," *IEEE Trans. on Computers*, vol. C-29, No. 6, pp. 510-514 (1980).

Touba et al., "Altering a pseudo-random bit sequence for scan-based BIST," *Proc. ITC*, pp. 167-175 (1996).

Touba et al., "Transformed pseudo-random patterns for BIST," *Proc. VLSI Test Symp.*, pp. 410-416 (1995).

Tsai et al., "STARBIST: Scan autocorrelated random pattern generation," *Proc. DAC*, pp. 472-477 (1997).

Venkataraman et al., "An Efficient BIST Scheme Based on Reseeding of Multiple Polynomial Linear Feedback Shift Registers," *IEEE*, pp. 572-577 (1993).

Waicukauski et al., "A method for generating weighted random test patterns," *IBM J. Res. Develop.*, vol. 33, No. 2, pp. 149-161 (Mar. 1989).

Wang, "BIST Using Pseudorandom Test Vectors and Signature Analysis," *IEEE Custom Integrated Circuits Conference*, pp. 1611-1618 (1998).

Williams et al., "Bounds and analysis of aliasing errors in linear-feedback shift registers," *IEEE Trans. CAD of Integrated Circuits and Systems*, vol. CAD-7, No. 1, pp. 75-83 (1988).

Written Opinion dated Sep. 5, 2001, from International Application No. PCT/US00/31376.

Wu et al., "Scan-Based BIST Fault Diagnosis," *IEEE Trans. CAD of Integrated Circuits and Systems*, vol. 18, No. 2, pp. 203-211 (Feb. 1999).

Wunderlich et al., "Bit-flipping BIST," *Proc. ICCAD*, pp. 337-343 (1996).

Wunderlich, "Multiple distribution for biased random test patterns," *Proc. ITC*, pp. 236-244 (1988).

Wunderlich, "On computing optimized input probabilities for random tests," *Proc. DAC*, pp. 392-398 (1987).

Yamaguchi et al., "An efficient method for compressing test data," *Proc. ITC*, pp. 191-199 (1997).

Yarmolik et al., "Generation and Application of Pseudorandom Sequences for Random Testing," J. Wiley & Sons, New York (1988).

Zacharia et al., "Decompression of Test Data Using Variable Length Seed LFSRs," *IEEE*, pp. 426-433 (1995).

Zacharia et al., "Two-Dimensional Test Data Decompressor for Multiple Scan Designs," *Proc. ITC*, pp. 186-194 (1996).

Bayraktaroglu et al., "Deterministic Partitioning Techniques for Fault Diagnosis in Scan-Based BIST," *Proc. ITC*, pp. 273-282 (2000).

Chan et al., "A Study of Faulty Signature for Diagnostics," *Proc. ISCAS*, pp. 2701-2704 (1990).

Chan et al., "A Study of Faulty Signatures Using a Matrix Formulation," *Proc. ITC*, pp. 553-561 (1990).

Damarla et al., "Multiple Error Detection and Identification via Signature Analysis," *Journal of Electronic Testing: Theory and Applications*, vol. 7, No. 3, pp. 193-207 (1995).

Edirisooriya et al., "Diagnosis of Scan Path Failures," *Proc. VLSI Test Symp.*, pp. 250-255 (1995).

European Communication dated Jul. 20, 2011, from European Application No. EP 09 17 5449.9, 5 pp.

Ghosh-Dastidar et al., "A Rapid and Scalable Diagnosis Scheme for BIST Environments with a Large Number of Scan Chains," *Proc. VLSI Test Symp.*, pp. 79-85 (2000).

McAnney et al., "There is Information in Faulty Signatures," *Proc. ITC*, pp. 630-636 (1987).

Savir et al., "Identification of Failing Tests with Cycling Registers," *Proc. ITC*, pp. 322-328 (1988).

Seuring et al., "Space Compaction of Test Responses for IP Cores Using Orthogonal Transmission Functions," *Proc. VLSI Test Symp.*, pp. 213-219 (2000).

Stroud et al., "Improving the Efficiency of Error Identification via Signature Analysis," *Proc. VLSI Test Symp.*, pp. 244-249 (1995).

Waicukauski et al., "Diagnosis of BIST Failures by PPSFP Simulation," *Proc. ITC*, pp. 480-484 (1987).

Waicukauski et al., "Failure Diagnosis of Structured VLSI," *IEEE Design and Test of Computers*, pp. 49-60 (Aug. 1989).

Zorian et al., "Programmable Space Compaction for BIST," *IEEE*, pp. 340-349 (Jun. 1993).

\* cited by examiner

METHOD AND APPARATUS FOR SELECTIVELY COMPACTING TEST RESPONSES

RELATED APPLICATION DATA

This application is a continuation of U.S. patent application Ser. No. 12/396,377, filed Mar. 2, 2009 now U.S. Pat. No. 7,805,649, which is a continuation of U.S. patent application Ser. No. 10/973,522, filed Oct. 25, 2004 now U.S. Pat. No. 7,500,163, which is a continuation of U.S. patent application Ser. No. 10/354,576, filed Jan. 29, 2003 now U.S. Pat. No. 6,829,740, which is a continuation of U.S. patent application Ser. No. 09/619,988, filed Jul. 20, 2000 now U.S. Pat. No. 6,557,129, which claims the benefit of U.S. Provisional Application No. 60/167,136, filed Nov. 23, 1999, all of which are hereby incorporated herein by reference.

TECHNICAL FIELD

This invention relates generally to testing of integrated circuits and more particularly relates to compaction of test responses used in testing for faults in integrated circuits.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers, as shown in U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2-5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

FIG. 1 is a block diagram of a conventional system 10 for testing digital circuits with scan chains. External automatic testing equipment (ATE), or tester, 12 applies a set of fully specified test patterns 14 one by one to a CUT 16 in scan mode via scan chains 18 within the circuit. The circuit is then run in normal mode using the test pattern as input, and the test response to the test pattern is stored in the scan chains. With the circuit again in scan mode, the response is then routed to the tester 12, which compares the response with a fault-free reference response 20, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework as shown in FIG. 2. In BIST, additional on-chip circuitry is included to generate test patterns, evaluate test responses, and control the test. For example, a pseudo-random pattern generator 21 is used to generate the test patterns, instead of having deterministic test patterns. Additionally, a multiple input signature register (MISR) 22 is used to generate and store a resulting signature from test responses. In conventional logic BIST, where pseudo-random patterns are used as test patterns, 95-96% coverage of stuck-at faults can be achieved provided that test points are employed to address random-pattern resistant faults. On average, one to two test points may be required for every 1000 gates. In BIST, all responses propagating to observable outputs and the signature register have to be known. Unknown values corrupt the signature and therefore must be bounded by additional test logic. Even though pseudo-random test patterns appear to cover a significant percentage of stuck-at faults, these patterns must be supplemented by deterministic patterns that target the remaining, random pattern resistant faults. Very often the tester memory required to store the supplemental patterns in BIST exceeds 50% of the memory required in the deterministic approach described above. Another limitation of BIST is that other types of faults, such as transition or path delay faults, are not handled efficiently by pseudo-random patterns. Because of the complexity of the circuits and the limitations inherent in BIST, it is extremely difficult, if not impossible, to provide a set of test patterns that fully covers hard-to-test faults.

Some of the DFT techniques include compactors to compress the test responses from the scan chains. There are generally two types of compactors: time compactors and spatial compactors. Time compactors typically have a feedback structure with memory elements for storing a signature, which represents the results of the test. After the signature is completed it is read and compared to a fault-free signature to determine if an error exists in the integrated circuit. Spatial compactors generally compress a collection of bits (called a vector) from scan chains. The compacted output is analyzed in real time as the test responses are shifted out of the scan chains. Spatial compactors can be customized for a given circuit under test to reduce the aliasing phenomenon, as shown in the U.S. Pat. No. 5,790,562 and in few other works based on multiplexed parity trees or nonlinear trees comprising elementary gates such as AND, OR, NAND, and NOR gates.

Linear spatial compactors are built of Exclusive-OR (XOR) or Exclusive-NOR (XNOR) gates to generate n test outputs from the m primary outputs of the circuit under test, where n<m. Linear compactors differ from nonlinear compactors in that the output value of a linear compactor changes with a change in just one input to the compactor. With nonlinear compactors, a change in an input value may go undetected at the output of the compactor. However, even linear compactors may mask errors in an integrated circuit. For example, the basic characteristic an XOR (parity) tree is that any combination of odd number of errors on its inputs propagates to their outputs, and any combination of even number of errors remains undetected.

An ideal compaction algorithm has the following features: (1) it is easy to implement as a part of the on-chip test circuitry, (2) it is not a limiting factor with respect to test time, (3) it provides a logarithmic compression of the test data, and (4) it does not lose information concerning faults. In general, however, there is no known compaction algorithm that satisfies all the above criteria. In particular, it is difficult to ensure that the compressed output obtained from a faulty circuit is not the same as that of the fault-free circuit. This phenomenon is often referred to as error masking or aliasing and is measured in terms of the likelihood of its occurrence. An example of error masking occurs when the spatial compactor reads two fault effects at the same time. The multiple fault effects cancel each other out and the compactor output is the same as if no faults occurred.

Unknown states are also problematic for error detection. An unknown state on one or more inputs of an XOR tree generates unknown values on its output, and consequently masks propagation of faults on other inputs. A common application of space compactors is to combine the observation points inserted into the CUT as a part of design-for-testability methodology. The spatial compactors can be also used to reduce the size of the time compactors by limiting the number of their parallel inputs.

Undoubtedly, the most popular time compactors used in practice are linear feedback shift registers (LFSRs). In its basic form, the LFSR (see FIG. 3) is modified to accept an external input in order to act as a polynomial divider. An alternative implementation (called type II LFSR) is shown in FIG. 4. The input sequence, represented by a polynomial, is divided by the characteristic polynomial of the LFSR. As the division proceeds, the quotient sequence appears at the output of the LFSR and the remainder is kept in the LFSR. Once testing is completed, the content of the LFSR can be treated as a signature.

FIG. 5 shows another time compactor (which is a natural extension of the LFSR-based compactor) called a multiple-input LFSR, also known as a multiple-input signature register (MISR). The MISR is used to test circuits in the multiple scan chain environment such as shown in the U.S. Pat. No. 4,503,537. MISRs feature a number of XOR gates added to the flip-flops. The CUT scan chain outputs are then connected to these gates.

FIG. 6 shows an example of a pipelined spatial compactor with a bank of flip-flops separating stages of XOR gates. A clock (not shown) controls the flip-flops and allows a one-cycle delay before reading the compacted output.

The limitation of spatial compactors, such as the one shown in FIG. 6, is that unknown states can reduce fault coverage. Time compactors, such as shown in FIGS. 3, 4, and 5, are completely unable to handle unknown states since an unknown state on any input can corrupt the compressed output generated by the compactor. With both time compactors and spatial compactors, multiple fault effects can reduce fault coverage. Additionally, if a fault effect is detected within the integrated circuit, these compactors have limited ability to localize the fault.

An object of the invention, therefore, is to provide an efficient compactor that can select which scan chains are analyzed. This ability to select allows the compactor to generate a valid compressed output even when receiving unknown states or multiple fault effects on its inputs. The compactor can also be used diagnostically to determine the location of faults within an integrated circuit.

SUMMARY

A compactor is disclosed that selects test responses in one or more scan chains to compact into a compressed output, while one or more other test responses are masked. Thus, test responses containing unknown states may be masked to ensure that the compactor generates a valid compressed output. Additionally, test responses can be masked to ensure fault masking does not occur. The compactor can also analyze test responses from individual scan chains to diagnostically localize faults in an integrated circuit.

A compactor includes selection circuitry that controls which scan chains are analyzed. The selection circuitry passes desired test responses from scan chains onto a compactor, while masking other test responses. In one embodiment, the selection circuitry may include an identification register that is loaded with a unique identifier of a scan chain. Based on the state of a flag register, either only the test response stored within the scan chain identified is passed to the compactor or all test responses are passed to the compactor except the test response associated with the identified scan chain.

In another embodiment, the selection circuitry includes a flag that controls whether only selected test responses are compacted or whether all test responses are compacted.

In yet another embodiment, a control register is used that individually identifies each scan chain included in compaction. In this embodiment, a variable number (e.g., 1, 2, 3, 4 . . . ) of test responses within scan chains may be included in compaction. Alternatively, the control register may store a unique identifier that is decoded to select one test response that is compacted.

In still another embodiment, the selection circuitry includes a control line that masks bits from scan chains on a per clock-cycle basis. Consequently, a test response may have only individual bits masked while the remaining bits of the test response are compacted.

The foregoing and other objects, features, and advantages of the invention will become more apparent from the following detailed description, which proceeds with reference to the following drawings.

DETAILED DESCRIPTION

Figure 1:
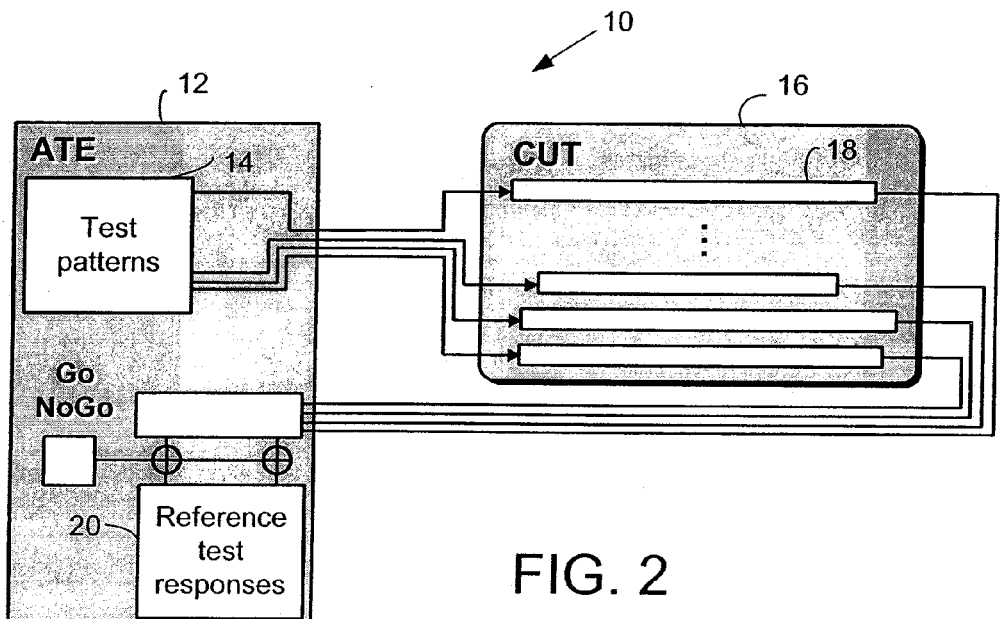
FIG. 1 is a block diagram of a prior art system for testing integrated circuits.
Figure 2:
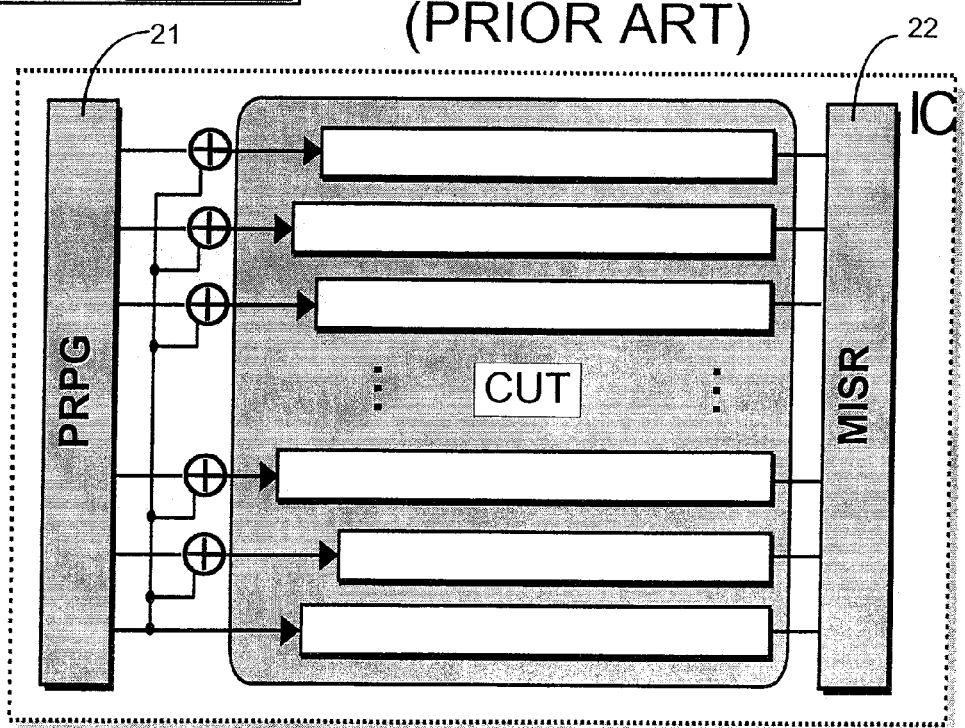
FIG. 2 is a block diagram of a prior art system using a built-in-test system.
Figure 3:
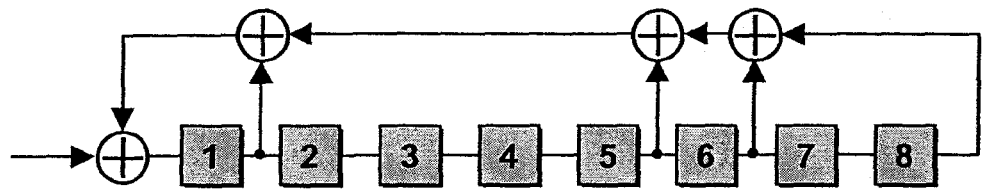
FIG. 3 is a circuit diagram of a prior art type I LFSR compactor.
Figure 4:
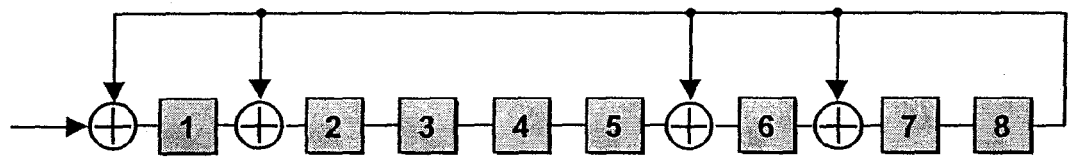
FIG. 4 is a circuit diagram of a prior art type II LFSR compactor.
Figure 5:
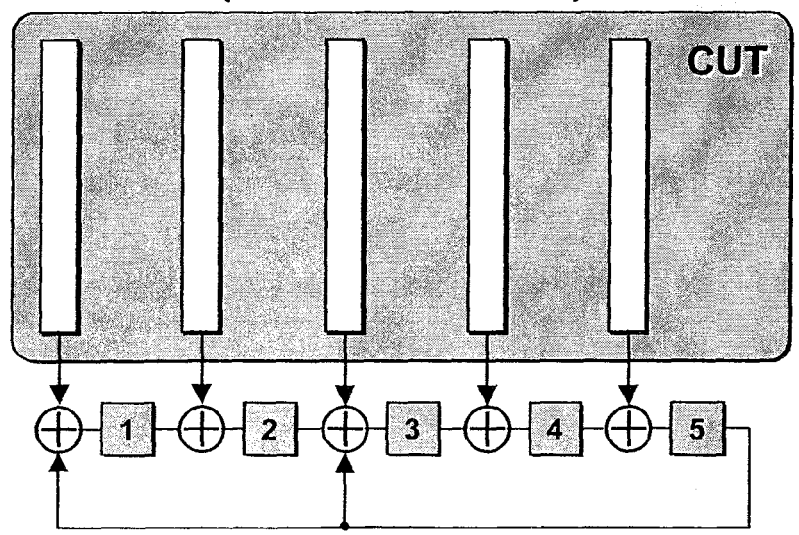
FIG. 5 is a circuit diagram of a prior art architecture of a multiple input signature register (MISR) compactor shown receiving input from scan chains.
Figure 6:
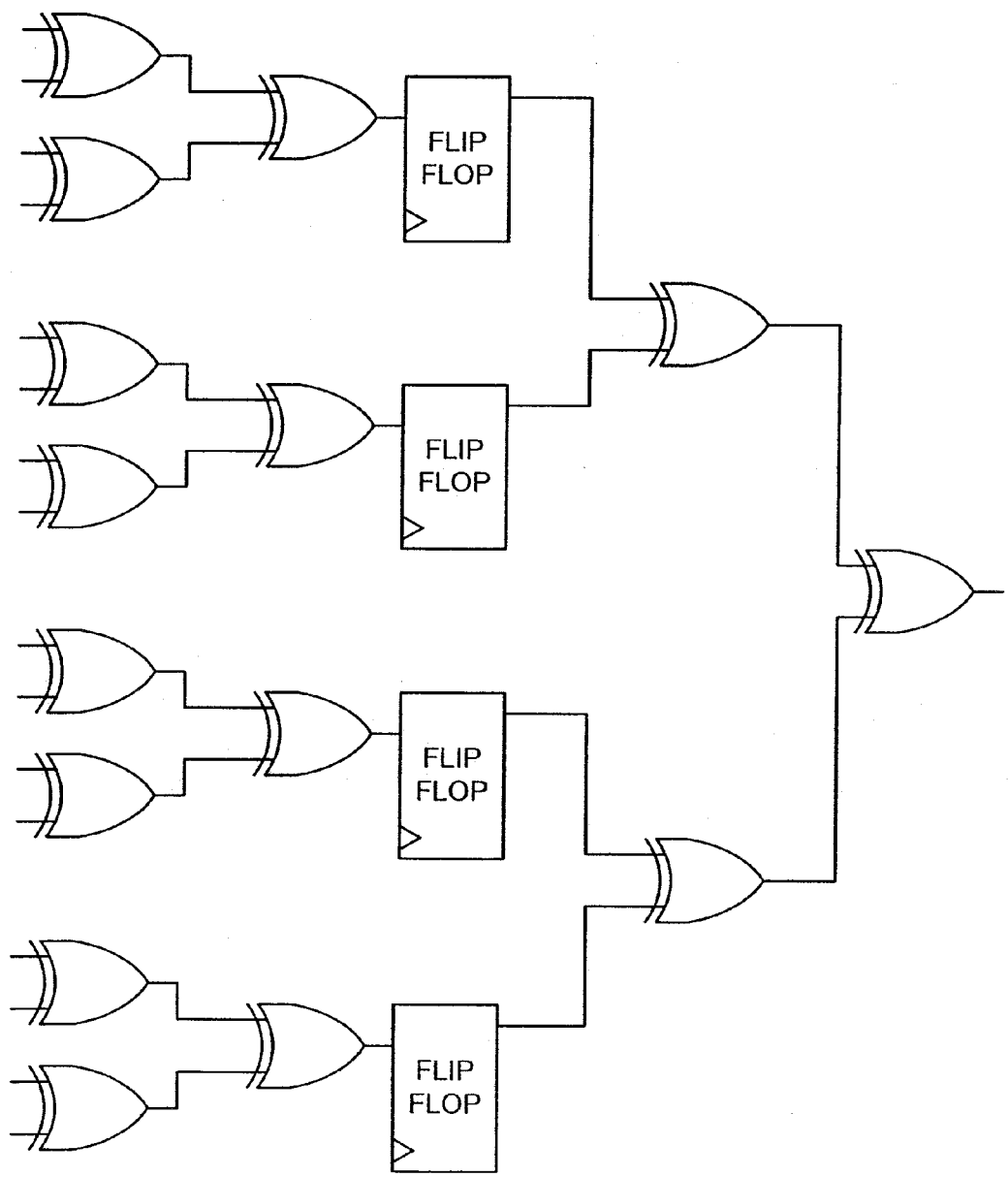
FIG. 6 is a circuit diagram of a prior art pipelined spatial compactor.
Figure 7:
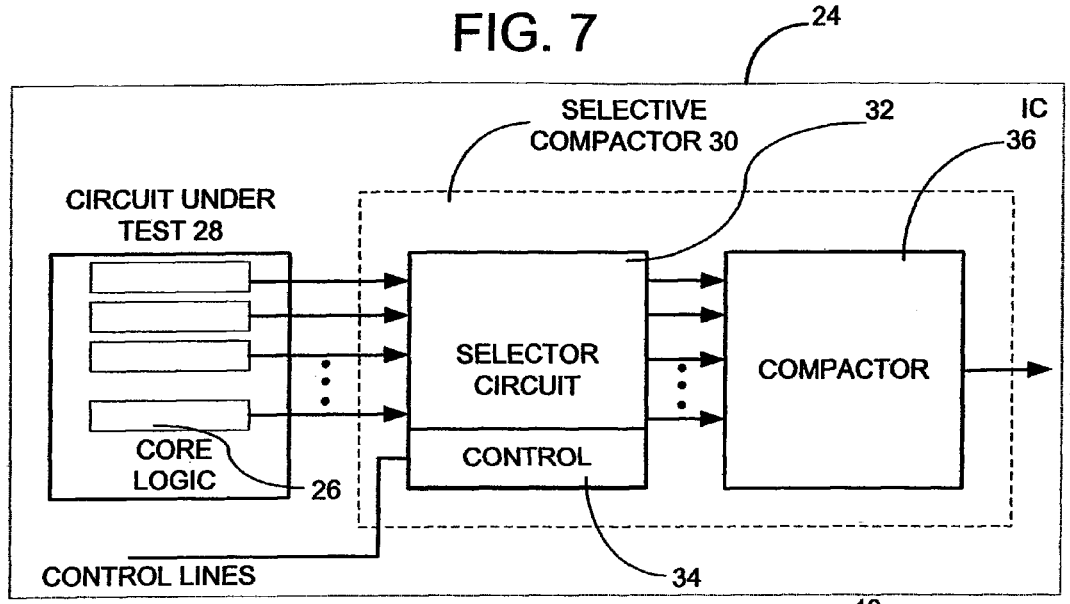
FIG. 7 is a block diagram of a selective compactor according to the invention.

FIG. 7 shows a block diagram of an integrated circuit 24 that includes multiple scan chains 26 in a circuit under test 28. A selective compactor 30 is coupled to the scan chains 26 and includes a selector circuit 32 and a compactor 36. The illustrated system is a deterministic test environment because the scan chains 26 are loaded with predetermined test patterns from an ATE (not shown). The test patterns are applied to the core logic of the integrated circuit to generate test responses, which are also stored in the scan chains 26 (each scan chain contains a test response). The test responses contain information associated with faults in the core logic of the integrated circuit 24. Unfortunately, the test responses may also contain unknown states and/or multiple fault effects, which can negatively impact the effective coverage of the test responses. For example, if a memory cell is not initialized, it may propagate an unknown state to the test response. The test responses are passed to the selector circuit 32 of the selective compactor 30. The selector circuit 32 includes control logic 34 that controls which of the test responses are passed through the selector circuit to the compactor 36. The control logic 34 can control the selector circuit 32 such that test responses with unknown states or multiple fault effects are masked. The control logic is controlled by one or more control lines. Although not shown, the control lines may be connected directly to a channel of an ATE or they may be connected to other logic within the integrated circuit. For example, the control lines may be coupled to a Linear Finite State Machine (e.g., LSFR type 1, LSFR type 2, cellular automata, etc.) in combination with a phase shifter. The compactor 36 receives the desired test responses from the selector circuit 32 and compacts the responses into a compressed output for analysis. The compressed output is compared against a desired output to determine if the circuit under test contains any faults. The selection circuitry, compactor, and circuit under test are all shown within a single integrated circuit. However, the selection circuitry and compactor may be located externally of the integrated circuit, such as within the ATE.

Figure 8:
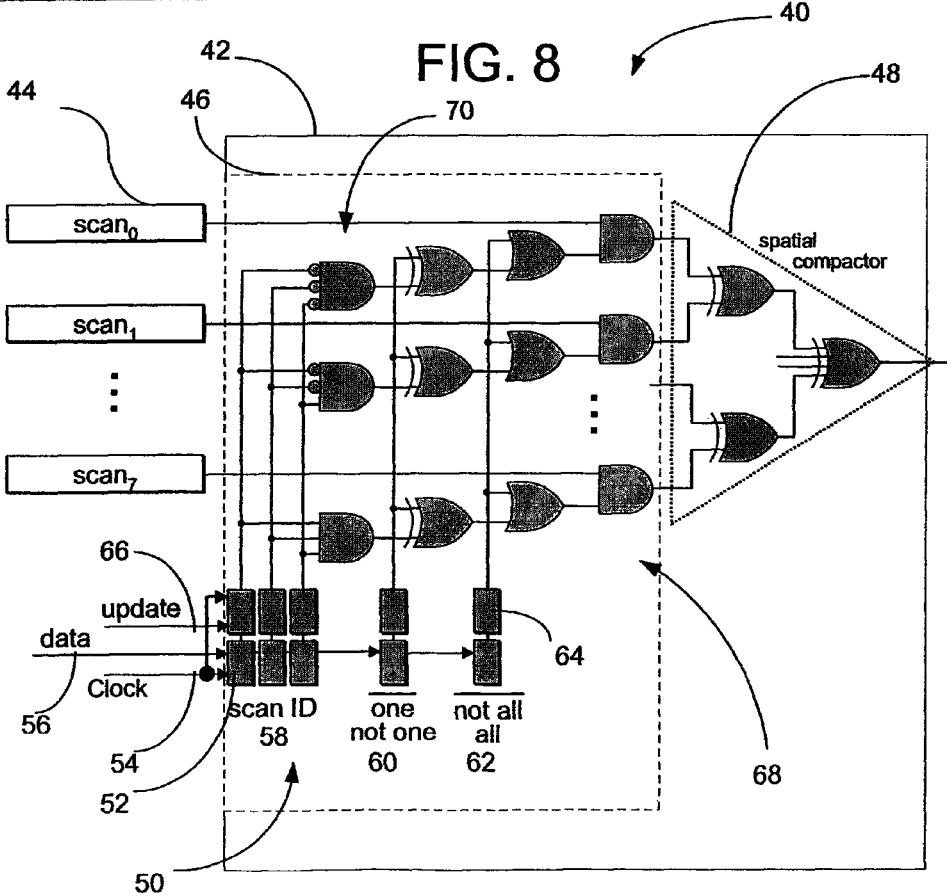
FIG. 8 shows one embodiment of a selective compactor, including selection circuitry and a spatial compactor, for masking test responses from scan chains.

FIG. 8 shows one example of an integrated circuit 40 that includes a selective compactor 42 coupled to multiple scan chains 44 within a circuit under test. Although only 8 scan chains are shown, the test circuit 40 may contain any number of scan chains. The selective compactor 42 includes a selector circuit 46 and a compactor 48. The compactor 48 is a linear spatial compactor, but any conventional parallel test-response compaction scheme can be used with the selector circuit 46, as further described below. The selector circuit 46 includes control logic 50, which includes an input register 52, shown in this example as a shift register. The input register 52 has a clock input 54 and a data input 56. Each cycle of a clock on the clock input 54, data from data input 56 shifts into the input register 52. The register 52 has multiple fields including a scan identification field 58, a "one/not one" field 60 and a "not all/all" field 62. A control register 64 has corresponding bit positions to input register 52, and upon receiving an update signal on an update line 66, the control register 64 loads each bit position from input register 52 in parallel. Thus, the control register 64 also contains fields 58, 60, and 62. Although the control register 64 is shown generically as a shift register, the update line 66 is actually a control line to a multiplexer (not shown) that allows each bit position in register 64 to reload its own data on each clock cycle when the update line deactivated. When the update line is activated, the multiplexer passes the contents of register 52 to corresponding bit positions of the control register 64. The control register 64 is then loaded synchronously with the clock.

The selector circuit 46 includes logic gates, shown generally at 68, coupled to the control register 64. The logic gates 68 are responsive to the different fields 58, 60, 62 of the control register 64. For example, the scan identification field 58 contains a sufficient number of bits to uniquely identify any of the scan chains 44. The scan identification field 58 of the control register 64 is connected to a decoder, shown at 70 as a series of AND gates and inverters. The decoder 70 provides a logic one on a decoder output depending on the scan identification field, while the other outputs of the decoder are a logic zero.

The one/not one field 60 of the control register 64 is used to either pass only one test response associated with the scan chain identified in the scan identification field 58 or pass all of the test responses except for the scan chain identified in the scan identification field. The all/not all field 62 is effectively an override of the other fields. In particular, field 62 controls whether all of the test responses in the scan chains 44 are passed to the compactor 48 or only the test responses as controlled by the scan identification field 58 and the one/not one field 60. With field 62 cleared, only test responses as controlled by the scan identification field 58 and field 60 pass to the compactor 48. Conversely, if the field 62 is set to a logic one, then all of the test responses from all of the scan chains 44 pass to the compactor 48 regardless of the scan identification field 58 and the one/not one field 60.

Figure 9:
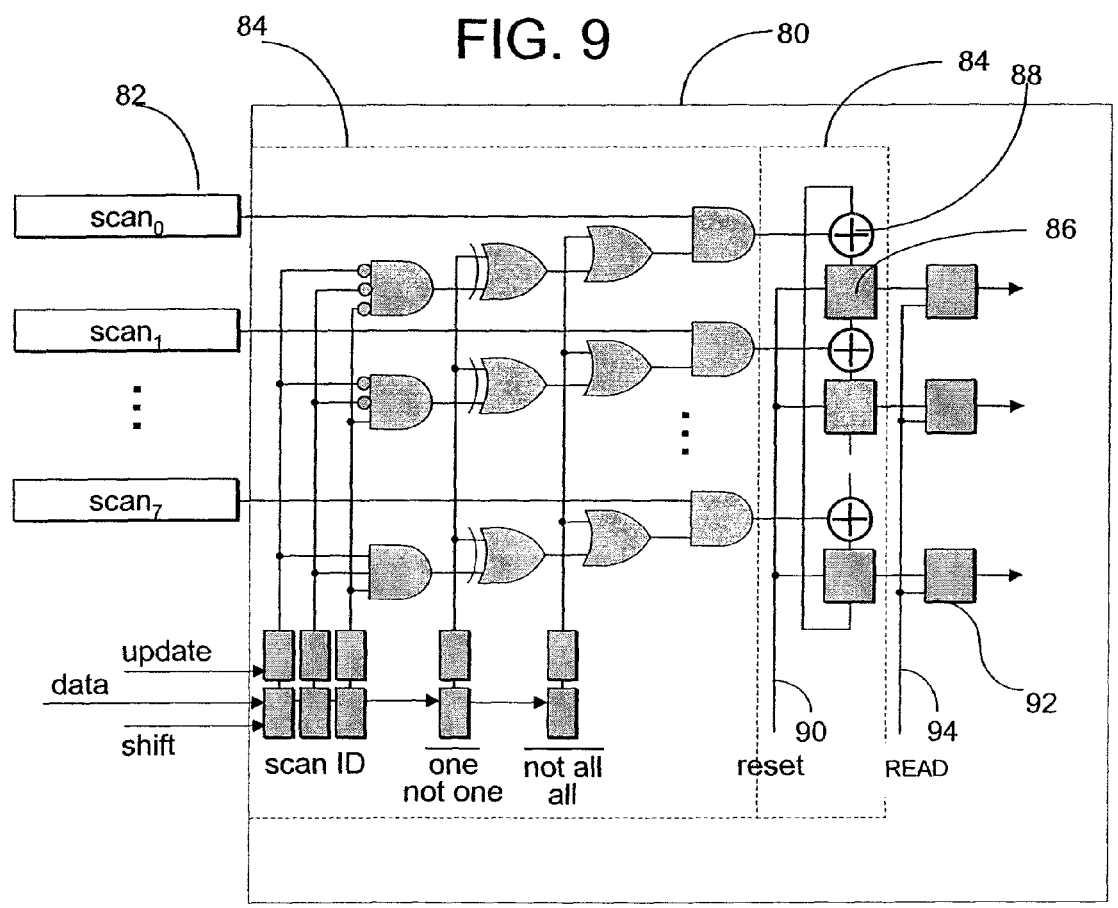
FIG. 9 is another embodiment of a selective compactor including selection circuitry and a time compactor for masking test responses from scan chains.

FIG. 9 shows another embodiment of a selective compactor 80 that is coupled to scan chains 82. The selective compactor includes a selector circuit 84, which is identical to the selector circuit 46 described in relation to FIG. 8. The selective compactor 80 also includes a time compactor 84, which is well understood in the art to be a circular compactor. The time compactor includes multiple flip-flops 86 and XOR gates 88 coupled in series. A reset line 90 is coupled to the flip-flops 86 to reset the compactor 84. The reset line may be reset multiple times while reading the scan chains. Output register 92 provides a valid output of the compactor 84 upon activation of a read line 94.

Referring to both FIGS. 8 and 9, in operation the scan chains 82 are serially loaded with predetermined test patterns by shifting data on scan channels (not shown) from an ATE (not shown). Simultaneously, the input register 52 is loaded with a scan identification and the controlling flags in fields 60, 62. The test patterns in the scan chains 44, 82 are applied to the circuit under test and test responses are stored in the scan chains. Prior to shifting the test responses out of the scan chains, the update line 66 is activated, thus moving fields 58, 60, 62 to the control register 64. The control register thereby controls the logic gates 68 to select the test responses that are passed to the compactors 48, 84. If the field 62 is in a state such that selection is not overridden, then certain of the test responses are masked. In the example of FIG. 8, the spatial compactor 48 provides the corresponding compressed output serially and simultaneously with shifting the test responses out of the scan chains. Conversely, in FIG. 9 the selective compactor 80 does not provide the appropriate compressed output until the read line 94 is activated. The selective compactor 80 provides a parallel compressed output as opposed to serial. The selective compactor 80 may be read multiple times (e.g., every eighth clock cycle) while reading out the test responses.

Figure 10:
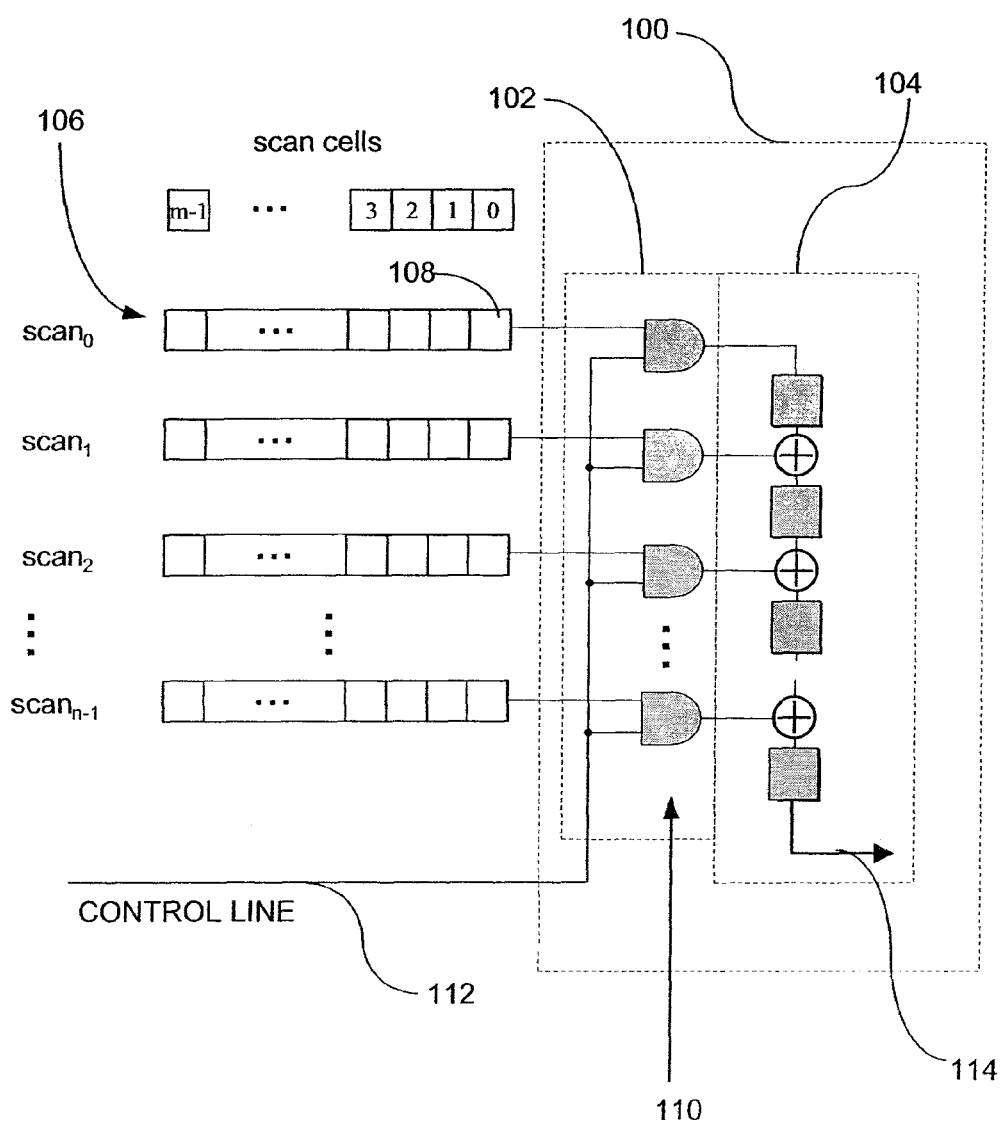
FIG. 10 is yet another embodiment of a selective compactor including selection circuitry and a cascaded compactor for masking individual bits of test responses from scan chains.

FIG. 10 shows another embodiment of a selective compactor 100. Again, the selective compactor includes a selector circuit 102 and a compactor 104. The compactor 104 is a type of spatial compactor called a cascaded compactor. N scan chains 106 include M scan cells 108, each of which stores one bit of the test response. The selector circuit 102 includes logic gates 110, in this case shown as AND gates, coupled to a control line 112. The compactor 104 is a time compactor with a single serial output 114. The control line 112 is used to mask the test responses. In particular, the control line 112 either masks all corresponding scan cells in the scan chains or allows all of the scan cells to pass to the compactor 80. The control line 112 operates to mask each column of scan cells, rather than masking an entire scan chain. Thus, individual bits from any scan chain can be masked on a per clock-cycle basis and the remaining bits of that scan chain applied to the compactor 104. With control line 112 activated, all bits from the scan chains pass to the compactor. With control line 112 deactivated, all bits from the scan chains are masked. Although FIG. 10 shows only a single control line, additional control lines can be used to mask different groups of scan chains. Additionally, although control line 112 is shown as active high, it may be configured as active low.

Figure 11:
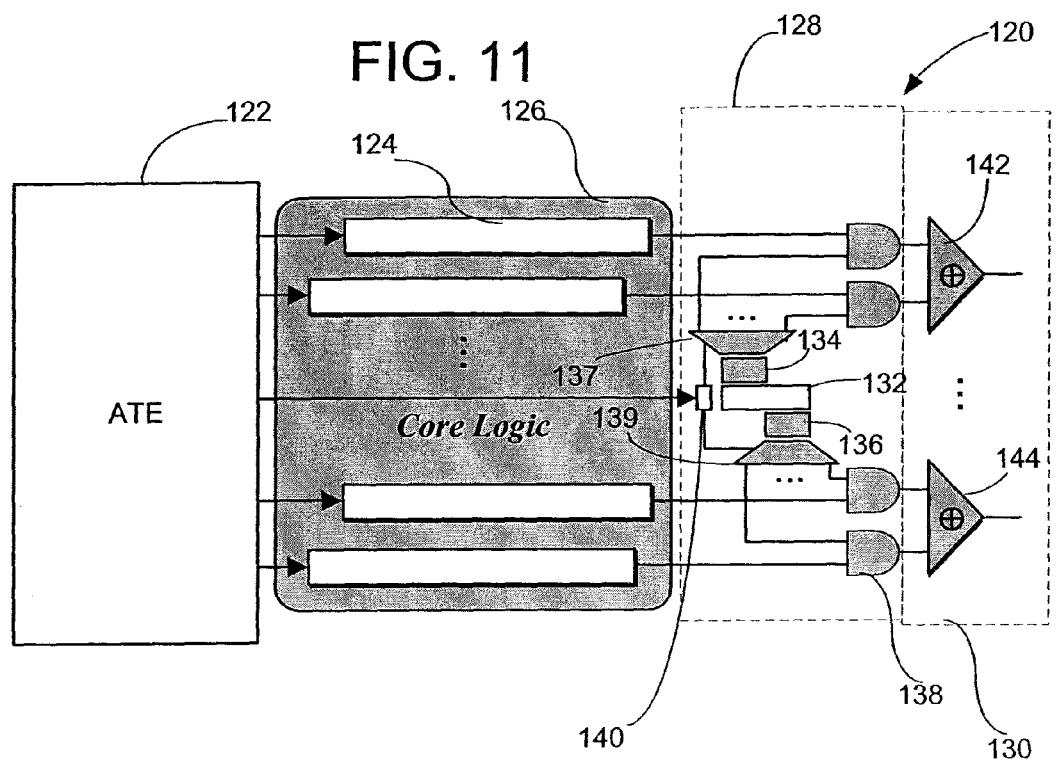
FIG. 11 is another embodiment of a selective compactor including selection circuitry and multiple compactors for masking test responses.

FIG. 11 shows yet another embodiment of the selective compactor 120. Automatic testing equipment 122 provides test patterns to the scan chains 124. The scan chains 124 are a part of the circuit under test 126. The patterns that are loaded into the scan chains 124 by the ATE are used to detect faults in the core logic of the circuit 126. The test responses are stored in the scan chains 124 and are clocked in serial fashion to the selective compactor 120. The selective compactor includes a selector circuit 128 and a compactor 130. The selector circuit 128 includes control logic including an input register 132, multiple control registers 134, 136, and multiple decoders 137 and 139. The register 132 is loaded with a pattern of bits that are moved to the control registers 134, 136 upon activation of an update line (not shown). The control registers 134, 136 are read by the decoders 137 and 139 and decoded to select one or more logic gates 138. A flag 140 is used to override the decoders 137 and 139 and pass all of the test responses to the compactor 130. Although only a single flag 140 is shown, multiple flags may be used to separately control the decoders. In this example, the compactor 130 includes multiple spatial compactors, such as compactors 142 and 144. Each control register may be loaded with different data so that the compactors 142, 144 can be controlled independently of each other.

Figure 12:
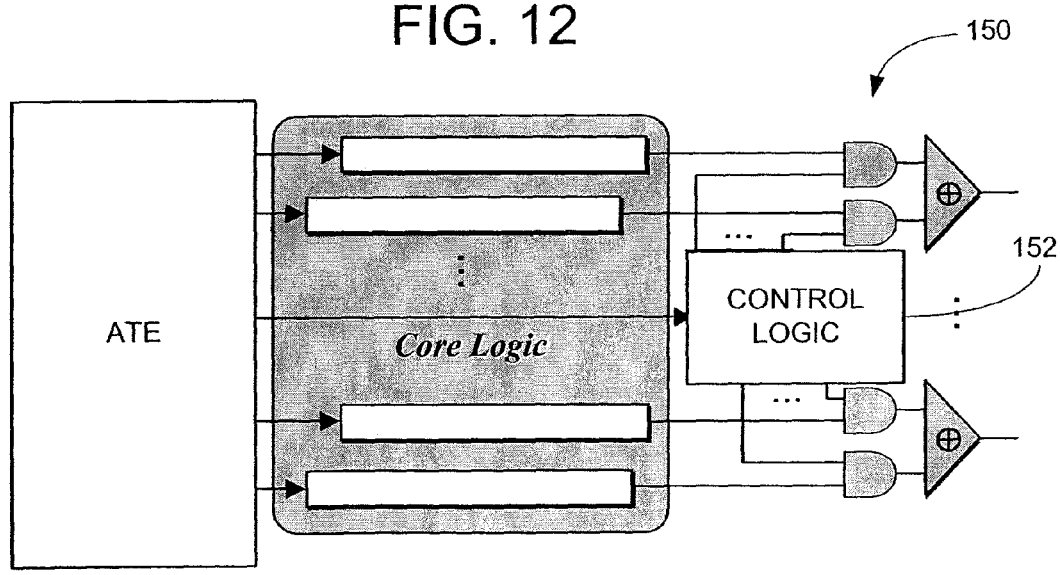
FIG. 12 is another embodiment of a selective compactor with selection circuitry that masks any variable number of test responses from the scan chains.

FIG. 12 shows yet another embodiment of the present invention with a selective compactor 150. Control logic 152 variably controls which test responses are masked and which test responses are compacted. Thus, activating the corresponding bit position in the control logic 152 activates the corresponding logic gate associated with that bit and allows the test response to pass to the compactor. Conversely, any bit that is not activated masks the corresponding test response.

Figure 13:
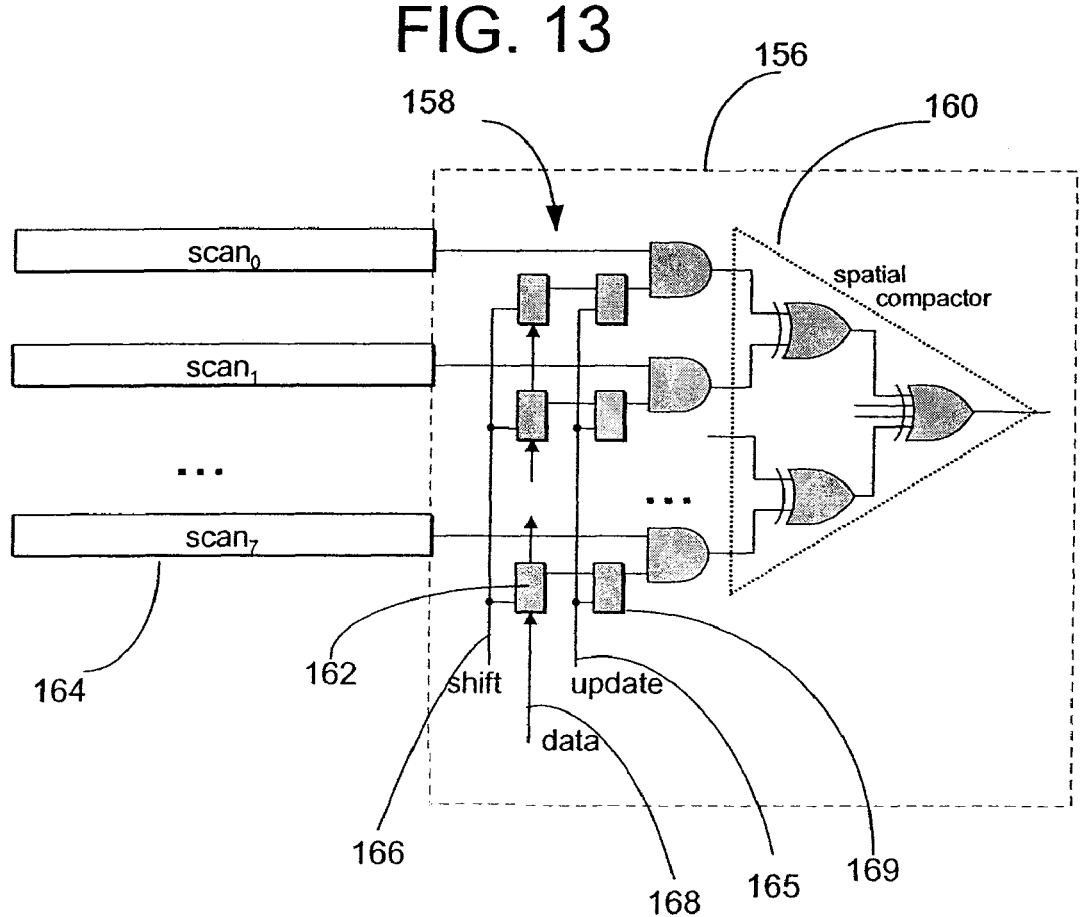
FIG. 13 is another embodiment of a selective compactor with programmable selection of scan chains.

FIG. 13 shows another embodiment of a selective compactor 156 including a selector circuit 158 and compactor 160. In this case, an input shift register 162 having a bit position corresponding to each scan chain 164 is used to selectively mask the scan chains. A clock is applied to line 166 to serially move data applied on data line 168 into the shift register 162. At the appropriate time, an update line 165 is activated to move the data from the shift register to a control register 169. Each bit position that is activated in the control register 169 allows a test response from the scan chains 164 to pass to the compactor. All other test responses are masked. Thus, the selective compactor can mask any variable number of test responses.

Each of the embodiments described above can be used as a diagnostic tool for localizing faults in the circuit under test. For example, each test response can be analyzed individually by masking all other test responses in the scan chains connected to the same compactor. By viewing the test response individually, the bit position in the test response containing fault effects can be determined.

Figure 14:
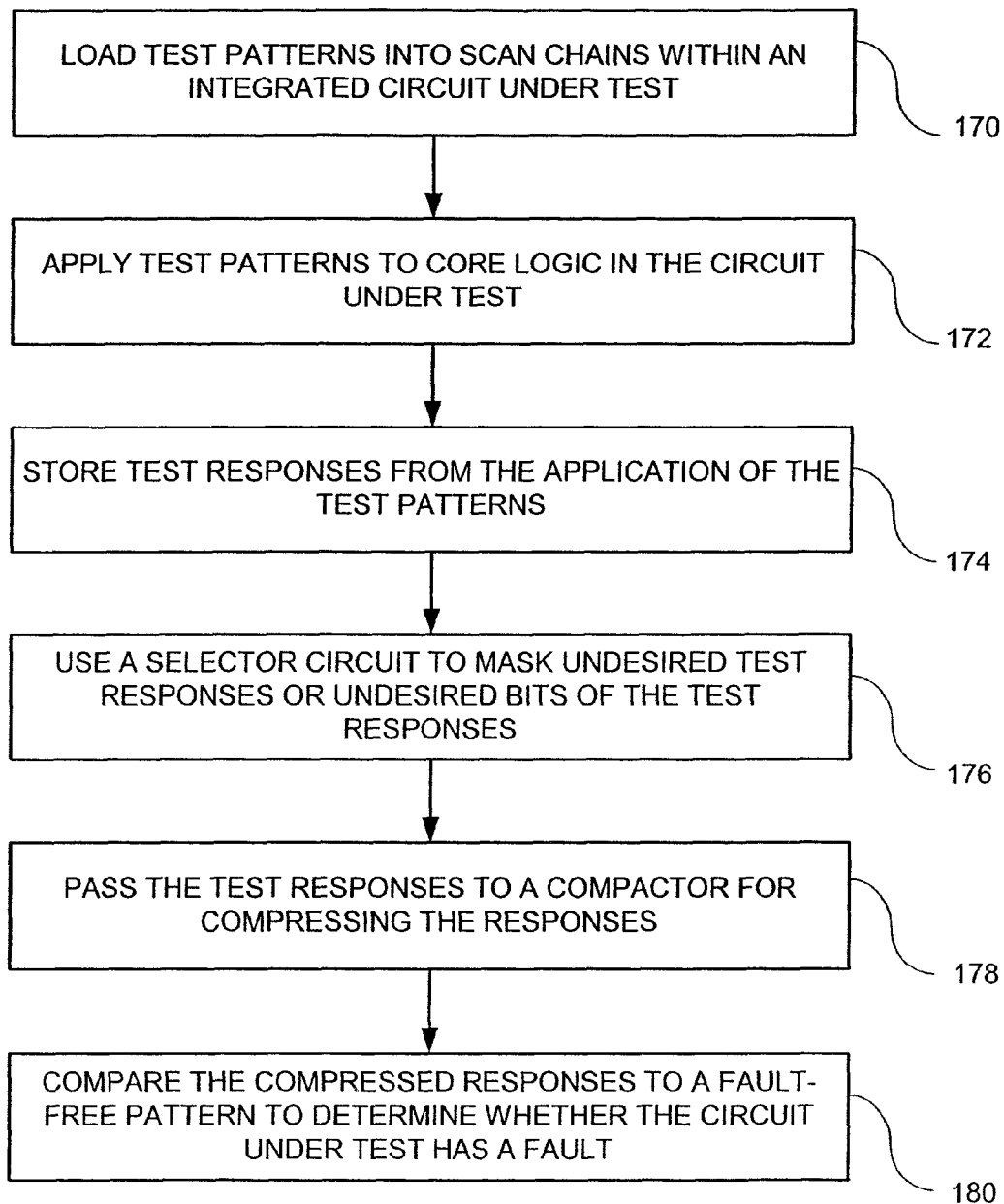
FIG. 14 is a flowchart of a method for selectively compacting test responses from scan chains.

FIG. 14 shows a flowchart of a method for selectively compacting test responses. In process block 170, an ATE loads predetermined test patterns into scan chains within an integrated circuit. This loading is typically accomplished by shifting the test patterns serially into the scan chains. The test patterns are applied to the circuit under test (process block 172) and the test responses are stored in the scan chains (process block 174). In process block 176, the selector circuit controls which test responses are masked. In particular, the selector circuit controls which scan chains are masked or which bits in the scan chains are masked. For example, in FIG. 8, the selector circuit masks the entire scan chain that is identified in the scan identification field 58. In FIG. 10, only individual bits of a scan chain are masked. In any event, in process block 176, the selector circuit typically masks unknown data or multiple fault effects so that the desired fault effect can propagate to the output (in some modes of operation, all of the test responses may pass to the output). In the event that the selector circuit includes a control register, the control register may be loaded concurrently with loading the test patterns in the scan chains or it can be loaded prior to reading the test responses. In process block 178, the test responses (one or more of which have been masked) are passed to the compactor and the compactor generates a compressed output associated with the test responses. In process block 180, the compressed output generated by the compactor is compared to an ideal response. If they match, the integrated circuit is assumed to be fault free.

Having illustrated and described the principles of the illustrated embodiments, it will be apparent to those skilled in the art that the embodiments can be modified in arrangement and detail without departing from such principles. For example, any of the illustrated compactors can be used with any of the illustrated selector circuits with minimum modification to create a selective compactor. Additionally, the selector circuit can easily be modified using different logic gates to achieve the selection functionality. For example, although the update lines are shown coupled to a separate bank of flip flops, the update lines can instead be coupled to input registers having tri-state outputs for controlling the logic in the selector circuit. Still further, although the scan chains are shown as serial shift registers, logic may be added so as to output test response data in parallel to the selective compactor. Additionally, although multiple spatial and time compactors were shown, compactors having features of both spatial and time compactors may be used. Indeed, any conventional or newly developed compactor may be used with the selection circuitry.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method, comprising:
   receiving test response values generated during testing of an integrated circuit, the test response values being responsive to deterministic test patterns applied to the integrated circuit;
   masking one or more of the test response values before the one or more of the test response values are input into one or more compactors, the one or more masked test response values including one or more unknown test response values or one or more test response values showing a fault effect, at least one of the one or more compactors comprising a feedback-free network of XOR or XNOR gates; and
   compacting the test response values, including the one or more masked test response values, in the one or more compactors.

2. The method of claim 1, wherein the masking is performed in response to one or more control signals generated by control logic.

3. The method of claim 2, further comprising generating the one or more control signals in the control logic by loading control bits into one or more control registers and decoding the control bits into the control signals.

4. The method of claim 1, wherein the masking includes masking all test response values to a test pattern for an input of one of the one or more compactors.

5. The method of claim 1, wherein the masking includes masking the one or more of the test response values on a clock-cycle-by-clock-cycle basis.

6. The method of claim 1, wherein the masking includes masking the one or more of the test response values on a test-pattern-by-test-pattern basis.

7. The method of claim 1, further comprising comparing the compacted test response values to a fault-free response to determine if there is a match.

8. The method of claim 1, wherein the one or more masked test response values are known values.

9. The method of claim 1, wherein the one or more test response values are output from scan chains in the integrated circuit.

10. A system, comprising:
    means for masking one or more test response values generated during testing of an integrated circuit before the one or more test response values are compacted, the test response values being responsive to deterministic test patterns applied to the integrated circuit, the one or more masked test response values including one or more unknown test response values or one or more test response values showing a fault effect; and
    means for compacting the test response values, including the one or more masked test response values, the means for compacting the test response values comprising a feedback-free network of XOR or XNOR gates.

11. The system of claim 10, wherein the means for masking operates in response to one or more control signals generated by control logic.

12. The system of claim 11, wherein the means for masking further comprises means for loading control bits into one or more control registers and means for decoding the control bits into the control signals.

13. The system of claim 10, wherein the means for masking includes means for masking all test response values to a test pattern for a respective input of the means for compacting the test response values.

14. The system of claim 10, wherein the means for masking includes means for masking the one or more test response values on a clock-cycle-by-clock-cycle basis.

15. The system of claim 10, wherein the means for masking includes means for masking the one or more test response values on a test-pattern-by-test-pattern basis.

16. The system of claim 10, further comprising means for comparing the compacted test response values to a fault-free response to determine if there is a match.

17. The system of claim 10, wherein the one or more masked test response values are known values.

* * * * *